United States Patent
Murata

(10) Patent No.: US 9,595,693 B2
(45) Date of Patent: Mar. 14, 2017

(54) ELECTRO-OPTICAL DEVICE, METHOD FOR MANUFACTURING ELECTRO-OPTICAL DEVICE, AND ELECTRONIC DEVICE

(71) Applicant: SEIKO EPSON CORPORATION, Tokyo (JP)

(72) Inventor: Satoshi Murata, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/613,914

(22) Filed: Feb. 4, 2015

(65) Prior Publication Data

US 2015/0228930 A1    Aug. 13, 2015

(30) Foreign Application Priority Data

Feb. 10, 2014   (JP) .................................. 2014-023080

(51) Int. Cl.
    *H01L 51/52*     (2006.01)
    *H01L 27/32*     (2006.01)

(52) U.S. Cl.
    CPC ...... *H01L 51/5271* (2013.01); *H01L 27/3244* (2013.01); *H01L 51/5265* (2013.01); *H01L 2251/5315* (2013.01)

(58) Field of Classification Search
    CPC ............. H01L 27/3244; H01L 51/5284; H01L 51/5281; H01L 2251/5315; H01L 29/4908
    See application file for complete search history.

(56) References Cited

U.S. PATENT DOCUMENTS

| 7,259,514 B2 | 8/2007 | Murayama et al. |
| 8,237,353 B2* | 8/2012 | Toyoda ............... H01L 51/5203 313/504 |
| 2004/0178724 A1* | 9/2004 | Karasawa ........... H01L 51/5281 313/506 |
| 2011/0158596 A1* | 6/2011 | Terada ................. G02B 6/1221 385/126 |
| 2014/0131688 A1 | 5/2014 | Okuno et al. |

FOREIGN PATENT DOCUMENTS

| JP | 2006012579 A | 1/2006 |
| JP | 2010020971 A | 1/2010 |
| JP | 2010097697 A | 4/2010 |
| JP | 2010251202 A | 11/2010 |
| JP | 2010272447 A | 12/2010 |
| JP | 2011086571 A | 4/2011 |
| JP | 2012243742 A | 12/2012 |
| JP | 2013165014 A | 8/2013 |

* cited by examiner

Primary Examiner — Tony Tran
(74) Attorney, Agent, or Firm — Oliff PLC

(57) ABSTRACT

Provided is a display apparatus in which a plurality of pixels are arranged. The pixels have a reflection layer, an optical distance adjusting layer, a pixel electrode, an insulating film, a light-emitting functional layer, and an opposing electrode that are sequentially layered in a Z direction. The insulating film has an opening that overlaps part of the pixel electrode. The reflection layer is disposed across the plurality of pixels, and has a high reflectance portion (where a first underlayer film and a reflection film are layered) and a low reflectance portion (where a second underlayer film and the reflection film are layered). The high reflectance portion (where the first underlayer film and the reflection film are layered) is disposed so as to overlap at least part of the opening when viewed from above.

6 Claims, 11 Drawing Sheets

ELECTRO-OPTICAL DEVICE, METHOD FOR MANUFACTURING ELECTRO-OPTICAL DEVICE, AND ELECTRONIC DEVICE

BACKGROUND

1. Technical Field

The present invention relates to an electro-optical device, a method for manufacturing the electro-optical device, and an electronic device in which the electro-optical device is mounted.

2. Related Art

For example, an organic electro luminescence (hereinafter, referred to as "organic EL") device having a resonant structure that amplifies light in a specific wavelength has been proposed (JP-A-2013-165014). The organic EL device described in JP-A-2013-165014 has a structure in which a low-reflection film, a reflection film, an insulating layer, a pixel electrode, an insulating film having an opening, a light-emitting functional layer, and an opposing electrode are sequentially layered in a light-emitting region of a pixel. Light emitted by the light-emitting functional layer is repeatedly reflected between the reflection film and the opposing electrode, so that the light is ejected as display light in which the light intensity at a resonant wavelength matching the optical path length between the reflection film and the opposing electrode is amplified.

The light-emitting functional layer is caused to emit light by application of a voltage between the pixel electrode and the opposing electrode. However, since the inside of the opening of the insulating film and the peripheral edge portion of the opening have different optical path lengths between the reflection film and the opposing electrode at least by a length corresponding to the optical distance of the insulating film, display light having different resonant wavelengths (colors) is ejected. Thus, the color purity of the display is lowered.

Accordingly, in the organic EL device described in JP-A-2013-165014, the reflection film is disposed inside the opening so that the light emitted by the light-emitting functional layer inside the opening is easily reflected, and the low-reflection film is disposed at the peripheral edge portion of the opening so that the light emitted by the light-emitting functional layer at the peripheral edge portion of the opening is less likely to be reflected, so that the problem that the color purity of the display is lowered is suppressed.

In the organic EL device described in JP-A-2013-165014, the reflection film is made of aluminum, alloy containing aluminum as a main component, or the like. In the case of forming the insulating layer on the reflection film, hillocks, voids, and the like easily occur in the aluminum, the alloy containing aluminum as a main component, or the like, for example, due to heat in formation of the insulating layer or stress of the insulating layer. Accordingly, the surface roughness of the reflection film increases, so that light emitted by the light-emitting functional layer is diffusely reflected by the reflection film, and is less likely to be reflected in a direction where the light serves as the display light. Thus, the brightness of the display light is lowered.

Moreover, the reflection film and the low-reflection film are patterned in the shape of an island in each pixel, and, thus, a difference in the height caused by the reflection film and the low-reflection film occurs for each pixel. Accordingly, the uniformity of the film thickness of the insulating layer formed on the reflection film becomes poor. Accordingly, the uniformity of the optical path length between the reflection film and the opposing electrode is lowered.

SUMMARY

An advantage of some aspects of the invention can be realized as the following embodiments or application examples.

Application Example 1 is directed to an electro-optical device in which a plurality of pixels are arranged. The pixels have a reflection layer, an optical distance adjusting layer, a pixel electrode, an insulating film, a light-emitting functional layer, and an opposing electrode that are sequentially layered in a first direction. The insulating film has an opening that overlaps part of the pixel electrode. The reflection layer is disposed across the plurality of pixels, and has a high reflectance portion and a low reflectance portion whose reflectance is lower than that of the high reflectance portion. The high reflectance portion is disposed so as to overlap at least part of the opening when viewed from above.

The light-emitting functional layer inside the opening and the light-emitting functional layer at the peripheral edge portion of the opening are caused to emit light by application of a voltage between the pixel electrode and the opposing electrode. The light emitted by the light-emitting functional layer is repeatedly reflected between the reflection layer and the opposing electrode, so that the light is amplified to have a specific wavelength (resonant wavelength) and is ejected as display light.

Since the reflection layer having high reflectance is disposed at least part of the inside of the opening, the light emitted by the light-emitting functional layer inside the opening is repeatedly reflected between the reflection layer having high reflectance and the opposing electrode, so that the light is amplified to have a resonant wavelength matching the optical path length between the reflection layer and the opposing electrode and is ejected as display light. Accordingly, it is possible to solve the problem of the known technique (JP-A-2013-165014) that, since the surface roughness of the reflection layer increases, reflection of light in a direction where the light serves as the display light is suppressed.

Since the reflection layer having low reflectance is disposed outside the opening (at the peripheral edge portion of the opening), the light emitted by the light-emitting functional layer outside the opening is less likely to be reflected, and is less likely to be ejected as display light. Since the inside of the opening and the outside of the opening have different optical path lengths between the reflection layer and the opposing electrode, light having different resonant wavelengths (colors) is ejected as display light. The light emitted by the light-emitting functional layer outside the opening is less likely to be ejected as display light, and, thus, the color purity of the display (image quality) is prevented from being lowered by display light having a different resonant wavelength (color) from that obtained inside the opening. Accordingly, an electro-optical device that realizes display with high image quality can be provided.

Application Example 2 is directed to the electro-optical device preferably as follows. The reflection layer has an underlayer film and a reflection film that are sequentially layered in the first direction. The underlayer film in the high reflectance portion is made of titanium. The underlayer film in the low reflectance portion is made of titanium nitride or titanium oxide. The reflection film is made of aluminum or alloy containing aluminum as a main component.

The reflection layer inside the opening is configured by an underlayer film made of titanium and a reflection film made of aluminum or alloy containing aluminum as a main component. With this configuration, if the optical distance adjusting layer is formed on the reflection layer, titanium of the underlayer film is diffused toward the reflection film, and the occurrence of hillocks and voids due to heat in formation of the optical distance adjusting layer, stress of the optical distance adjusting layer, or the like is suppressed. Thus, even when the optical distance adjusting layer is formed on the reflection layer, the high reflectance of the reflection layer inside the opening can be maintained, and the reflection layer having high reflectance can be disposed inside the opening.

The reflection layer outside the opening is configured by an underlayer film made of titanium nitride or titanium oxide and a reflection film made of aluminum or alloy containing aluminum as a main component. With this configuration, if the optical distance adjusting layer is formed on the reflection layer, diffusion of titanium toward the reflection film is suppressed, and hillocks and voids easily occur in the reflection layer due to heat in formation of the optical distance adjusting layer, stress of the optical distance adjusting layer, or the like. Thus, if the optical distance adjusting layer is formed on the reflection layer, the surface roughness of the reflection layer increases, and the light emitted by the light-emitting functional layer outside the opening is less likely to be reflected in a direction where the light serves as the display light. That is to say, the reflection layer having low reflectance can be disposed outside the opening.

Application Example 3 is directed to the electro-optical device preferably as follows. The reflection layer has an underlayer film and a reflection film that are sequentially layered in the first direction. The underlayer film is made of titanium. The reflection film is made of aluminum or alloy containing aluminum as a main component. A face, on the reflection film side, of the underlayer film in the low reflectance portion is covered by titanium nitride or titanium oxide.

The reflection layer inside the opening is configured by an underlayer film made of titanium and a reflection film made of aluminum or alloy containing aluminum as a main component. With this configuration, if the optical distance adjusting layer is formed on the reflection layer, titanium of the underlayer film is diffused toward the reflection film, and the occurrence of hillocks and voids in the reflection layer due to heat in formation of the optical distance adjusting layer, stress of the optical distance adjusting layer, or the like is suppressed. Thus, even when the optical distance adjusting layer is formed on the reflection layer, the high reflectance of the reflection layer inside the opening can be maintained, and the reflection layer having high reflectance can be disposed inside the opening.

The reflection layer outside the opening is configured by an underlayer film made of titanium and a reflection film made of aluminum or alloy containing aluminum as a main component, a face, on the reflection film side, of the underlayer film is covered by titanium nitride or titanium oxide. With this configuration, if the optical distance adjusting layer is formed on the reflection layer, diffusion of titanium toward the reflection film is suppressed by the titanium nitride or the titanium oxide, and hillocks and voids easily occur in the reflection layer due to heat in formation of the optical distance adjusting layer, stress of the optical distance adjusting layer, or the like. Thus, if the optical distance adjusting layer is formed on the reflection layer, the surface roughness of the reflection layer increases, and the light emitted by the light-emitting functional layer outside the opening is less likely to be reflected in a direction where the light serves as the display light. That is to say, the reflection layer having low reflectance can be disposed outside the opening.

Application Example 4 is directed to the electro-optical device preferably as follows. The reflection layer has an underlayer film and a reflection film that are sequentially layered in the first direction. The underlayer film is made of titanium. The reflection film is made of aluminum or alloy containing aluminum as a main component. Nitrogen or oxygen is introduced to a face, on the reflection film side, of the underlayer film in the low reflectance portion.

The reflection layer inside the opening is configured by an underlayer film made of titanium and a reflection film made of aluminum or alloy containing aluminum as a main component. With this configuration, if the optical distance adjusting layer is formed on the reflection layer, titanium of the underlayer film is diffused toward the reflection film, and the occurrence of hillocks and voids in the reflection layer due to heat in formation of the optical distance adjusting layer, stress of the optical distance adjusting layer, or the like is suppressed. Thus, even when the optical distance adjusting layer is formed on the reflection layer, the high reflectance of the reflection layer inside the opening can be maintained, and the reflection layer having high reflectance can be disposed inside the opening.

The reflection layer outside the opening is configured by an underlayer film made of titanium and a reflection film made of aluminum or alloy containing aluminum as a main component, and nitrogen or oxygen is introduced to a face, on the reflection film side, of the underlayer film. With this configuration, if the optical distance adjusting layer is formed on the reflection layer, diffusion of titanium toward the reflection film is suppressed by the nitrogen or the oxygen, and hillocks and voids easily occur in the reflection layer due to heat in formation of the optical distance adjusting layer, stress of the optical distance adjusting layer, or the like. Thus, if the optical distance adjusting layer is formed on the reflection layer, the surface roughness of the reflection layer increases, and the light emitted by the light-emitting functional layer outside the opening is less likely to be reflected in a direction where the light serves as the display light. That is to say, the reflection layer having low reflectance can be disposed outside the opening.

Application Example 5 is directed to the electro-optical device preferably as follows. The reflection layer has an underlayer film and a reflection film that are sequentially layered in the first direction. The underlayer film is disposed in the high reflectance portion. The reflection film is disposed in the high reflectance portion and the low reflectance portion. The underlayer film is made of titanium. The reflection film is made of aluminum or alloy containing aluminum as a main component.

The reflection layer inside the opening is configured by an underlayer film made of titanium and a reflection film made of aluminum or alloy containing aluminum as a main component. With this configuration, if the optical distance adjusting layer is formed on the reflection layer, titanium of the underlayer film is diffused toward the reflection film, and the occurrence of hillocks and voids in the reflection layer due to heat in formation of the optical distance adjusting layer, stress of the optical distance adjusting layer, or the like is suppressed. Thus, even when the optical distance adjusting layer is formed on the reflection layer, the high reflectance of the reflection layer inside the opening can be maintained, and the reflection layer having high reflectance can be disposed inside the opening.

Since the reflection layer outside the opening is made of aluminum or alloy containing aluminum as a main component, if the optical distance adjusting layer is formed on the reflection layer, hillocks and voids easily occur in the reflection layer due to heat in formation of the optical distance adjusting layer, stress of the optical distance adjusting layer, or the like. Thus, if the optical distance adjusting layer is formed on the reflection layer, the surface roughness of the reflection layer increases, and the light emitted by the light-emitting functional layer outside the opening is less likely to be reflected in a direction where the light serves as the display light. That is to say, the reflection layer having low reflectance can be disposed outside the opening.

Application Example 6 is directed to an electronic device, including the above-described electro-optical device.

In the electro-optical device according to the application examples, the light emitted by the light-emitting functional layer inside the opening is easily reflected, and the light emitted by the light-emitting functional layer outside the opening is less likely to be reflected. Accordingly, the light emitted by the light-emitting functional layer inside the opening is reflected between the reflection layer and the opposing electrode, so that the light is amplified to have a specific wavelength (resonant wavelength) and is ejected as display light, and, thus, display with high image quality is provided. Accordingly, an electronic device including the electro-optical device according to the application examples can provide display with high image quality. For example, it is possible to provide display with high image quality, by applying the electro-optical device according to the application examples to an electronic device having a display portion, such as a head-mounted display, a head-up display, an electronic viewfinder of a digital camera, a portable information terminal, a navigator, or the like.

Application Example 7 is directed to a method for manufacturing an electro-optical device in which pixels are arranged in a matrix. The pixels have an underlayer film, a reflection film, an optical distance adjusting layer, a pixel electrode, an insulating film having an opening overlapping the pixel electrode, a light-emitting functional layer, and an opposing electrode that are sequentially layered in a first direction. The method includes: forming the underlayer film by depositing titanium; forming a protective film that overlaps at least part of the opening when viewed from above; introducing nitrogen or oxygen to the underlayer film at a portion thereof not covered by the protective film; removing the protective film; and forming the reflection film by depositing aluminum or alloy containing aluminum as a main component.

After the underlayer film is formed across a plurality of pixels by depositing titanium, the underlayer film at a portion thereof that overlaps at least part of the opening is covered by the protective film, and nitrogen or oxygen is introduced to the underlayer film at a portion thereof not covered by the protective film. Then, the protective film is removed, so that an underlayer film can be formed in which a portion thereof that overlaps at least part of the opening is made of titanium and a portion other than the portion that overlaps at least part of the opening is made of nitrogen-introduced or oxygen-introduced titanium. In other words, the surface of titanium other than the portion that overlaps at least part of the opening is nitrided or oxidized, so that an underlayer film made of nitrogen-introduced or oxygen-introduced titanium is formed.

Then, a reflection film made of aluminum or alloy containing aluminum as a main component is deposited on the underlayer film, so that a reflection layer configured by the underlayer film and the reflection film is formed across a plurality of pixels.

If the optical distance adjusting layer is formed on the reflection layer inside the opening, titanium of the underlayer film is diffused toward the reflection film, and the reflection film is less likely to be deformed due to heat in formation of the optical distance adjusting layer, stress of the optical distance adjusting layer, or the like. Thus, the high reflectance of the reflection layer is maintained. That is to say, the reflection layer at a portion thereof where the underlayer film is made of titanium has high reflectance.

If the optical distance adjusting layer is formed on the reflection layer outside the opening, diffusion of titanium toward the reflection film is suppressed by the nitrogen or the oxygen, and hillocks and voids easily occur in the reflection layer due to heat in formation of the optical distance adjusting layer, stress of the optical distance adjusting layer, or the like. Accordingly, the surface roughness of the reflection film increases, so that the light emitted by the light-emitting functional layer outside the opening is less likely to be reflected in a direction where the light serves as the display light. That is to say, the reflection layer at a portion thereof where the underlayer film is made of nitrided or oxidized titanium has low reflectance.

Since the reflection layer having low reflectance is disposed outside the opening (at the peripheral edge portion of the opening), the light emitted by the light-emitting functional layer outside the opening is less likely to be reflected, and is less likely to be ejected as display light. Since the inside of the opening and the outside of the opening have different optical path lengths between the reflection film and the opposing electrode, light having different resonant wavelengths (colors) is ejected as display light. The light emitted by the light-emitting functional layer outside the opening is less likely to be ejected as display light, and, thus, the color purity of the display (image quality) is prevented from being lowered by display light having a different resonant wavelength (color) from that obtained inside the opening. Accordingly, display with high image quality can be provided.

Moreover, since the reflection layer is formed across a plurality of pixels, it is possible to improve the flatness of the reflection layer compared with the known technique (JP-A-2013-165014) in which the reflection layer is patterned in the shape of an island in each pixel.

Application Example 8 is directed to the method for manufacturing an electro-optical device preferably as follows. The introducing nitrogen or oxygen is exposing to plasma of nitrogen-containing or oxygen-containing gas.

If the underlayer film at a portion thereof not covered by the protective film is exposed to plasma of nitrogen-containing or oxygen-containing gas, nitrogen or oxygen can be introduced to titanium of the underlayer film at the portion not covered by the protective film.

Application Example 9 is directed to the method for manufacturing an electro-optical device preferably as follows. The introducing nitrogen or oxygen is converting nitrogen or oxygen into ions and increasing the speed of the ions, thereby implanting the ions.

If nitrogen or oxygen is converted into ions and the speed of the ions is increased so that the ions are implanted into the underlayer film at a portion thereof not covered by the protective film, nitrogen or oxygen can be introduced to titanium of the underlayer film at the portion not covered by the protective film.

Application Example 10 is directed to the method for manufacturing an electro-optical device preferably as follows. The introducing nitrogen or oxygen is performing heat treatment in a nitrogen atmosphere or an oxygen atmosphere.

If the underlayer film at a portion thereof not covered by the protective film is subjected to heat treatment in a nitrogen atmosphere or an oxygen atmosphere, nitrogen or oxygen can be introduced to titanium of the underlayer film at the portion not covered by the protective film.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
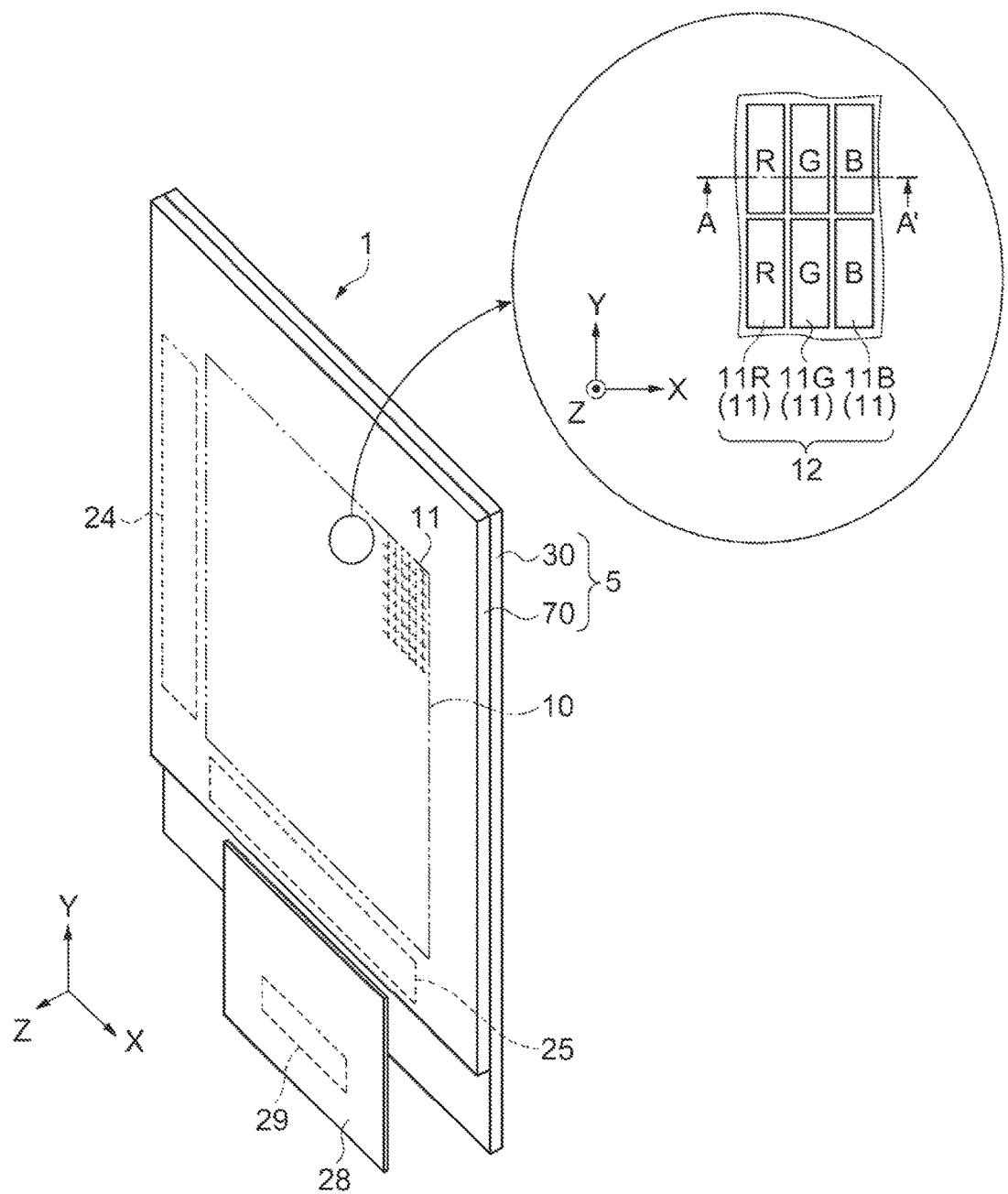
FIG. 1 is a perspective view showing the configuration of a display apparatus according to Embodiment 1.

Hereinafter, embodiments of the invention will be described with reference to the drawings. These embodiments are merely examples of the invention, and do not limit the invention. Various modifications can be freely made within the technical idea of the invention. Note that, in the drawings below, layers and constituent components are shown in scales different from the actual scales, so that each of the layers and the constituent components is large enough to be recognized in the drawings.

Embodiment 1

Outline of the Display Apparatus

Figure 2:
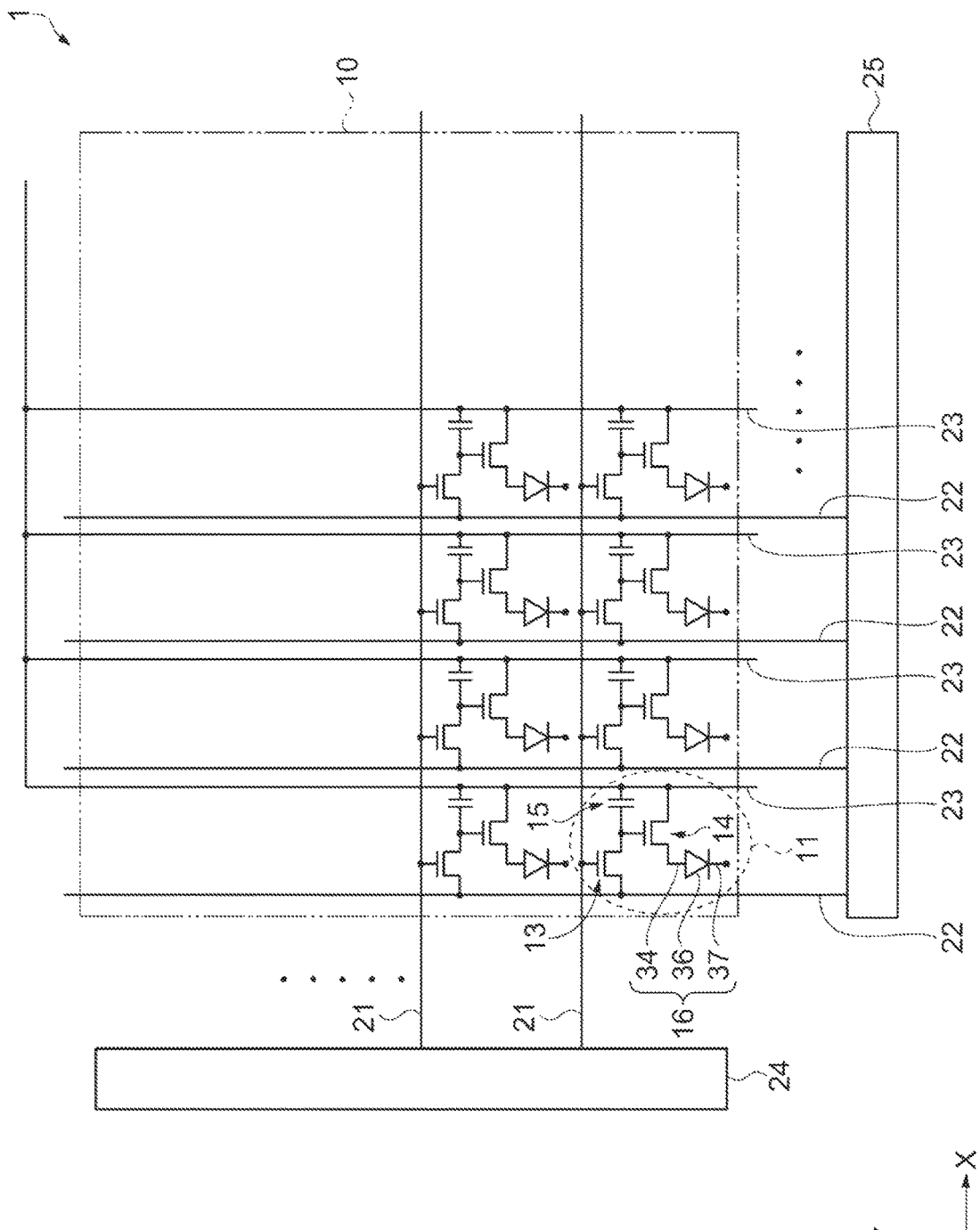
FIG. 2 is an equivalent circuit diagram showing the electrical configuration of the display apparatus according to Embodiment 1.

FIG. 1 is a perspective view showing the configuration of a display apparatus according to Embodiment 1. FIG. 2 is an equivalent circuit diagram showing the electrical configuration of the display apparatus according to this embodiment.

First, the outline of a display apparatus 1 will be described with reference to FIGS. 1 and 2.

The display apparatus 1 according to this embodiment is an exemplary electro-optical device in which the display apparatus 1 is a self-emitting display apparatus in which pixels 11 having light-emitting elements 16 (described later) are arranged in a matrix (see FIG. 2).

As shown in FIG. 1, the display apparatus 1 is configured by a display panel 5, a flexible substrate 28, and the like. The display panel 5 includes a display region 10. As shown in an enlarged view in the upper right of FIG. 1, the display region 10 includes pixels arranged in a stripe pattern, consisting of pixels (R pixels) 11R that emit red (R) light, pixels (G pixels) 11G that emit green (G) light, and pixels (B pixels) 11B that emit blue (B) light. Three pixels 11 corresponding to an R pixel 11R, a G pixel 11G, and a B pixel 11B form a display unit 12, thereby realizing full-color display.

In the description below, a direction along one side of the display panel 5 close to the flexible substrate 28 is taken as an X direction. A direction along two sides intersecting the one side and facing each other is taken as a Y direction. Further, a direction orthogonal to the X direction and the Y direction and along the thickness direction of the display panel 5 is taken as a Z direction.

Note that the Z direction is an example of "first direction" in the invention.

The display panel 5 is a display member for providing full-color display, and has an element substrate 30, a sealing substrate 70, and the like.

The element substrate 30 includes the display region 10 in which the pixels 11 are arranged in a matrix in the X direction and the Y direction, drive circuits (a scanning line driving circuit 24 and a data line driving circuit 25) for driving the pixels 11, and the like. The scanning line driving circuit 24 is disposed between the display region 10 and at least one of the sides extending in the Y direction of the element substrate 30. The data line driving circuit 25 is disposed between the display region 10 and the side of the element substrate 30 on which the flexible substrate 28 is attached.

One side of the element substrate 30 projects from the sealing substrate 70, and the flexible substrate 28 is attached to this projecting region. The flexible substrate 28 is provided with a drive IC 29 that supplies signals, power sources, and the like for driving the scanning line driving circuit 24 and the data line driving circuit 25 to the element substrate 30.

As shown in FIG. 2, in the display region 10, a plurality of scanning lines 21 extend in the X direction, and a plurality of data lines 22 and power supply lines 23 extend in the Y direction. The scanning lines 21 are connected to the scanning line driving circuit 24, and the data lines 22 are connected to the data line driving circuit 25. The scanning lines 21 and the data lines 22 intersect each other, and the pixels 11 are formed in the respective regions defined by the scanning lines 21 and the data lines 22.

In each pixel 11, a switching transistor 13, a holding capacitor 15, a drive transistor 14, a light-emitting element 16, and the like are formed. A scanning signal is supplied from the scanning line driving circuit 24 via the scanning lines 21 to the gate of the switching transistor 13. When the switching transistor 13 is turned on, a signal is supplied from the data line driving circuit 25 via the data line 22 and the switching transistor 13 to the holding capacitor 15. The signal held by the holding capacitor 15 is supplied to the gate of the drive transistor 14. When the drive transistor 14 is turned on, a current flows from the power supply line 23 via the drive transistor 14 to a pixel electrode 34, and a voltage (potential) Vp of the pixel electrode 34 changes. In other words, a display signal (the voltage Vp) is supplied from the power supply line 23 via the drive transistor 14 to the pixel electrode 34. The display signal supplied to the pixel electrode 34 changes in accordance with the signal supplied from the data line driving circuit 25 and held by the holding capacitor 15. As a result, the voltage Vp of the pixel electrode 34 changes.

The light-emitting element 16 is configured by the pixel electrode 34, a light-emitting functional layer 36, and an opposing electrode 37. A reference voltage (e.g., 0 V) smaller than the voltage Vp of the pixel electrode 34 is supplied to the opposing electrode 37. That is to say, a voltage Vo of the opposing electrode 37 is constant at 0 V. As a result, the voltage Vp of the pixel electrode 34 is applied to the light-emitting functional layer 36 between the pixel electrode 34 and the opposing electrode 37.

The light-emitting functional layer 36 has a threshold voltage (minimum voltage) Vth for emission of light. When the voltage Vp of the pixel electrode 34 becomes larger than the threshold voltage Vth, the light-emitting functional layer 36 emits light. As the voltage Vp of the pixel electrode 34 increases, a current that flows through the light-emitting element 16 increases, and the brightness of the light emitted by the light-emitting functional layer 36 increases.

Outline of the Display Panel

Figure 3:
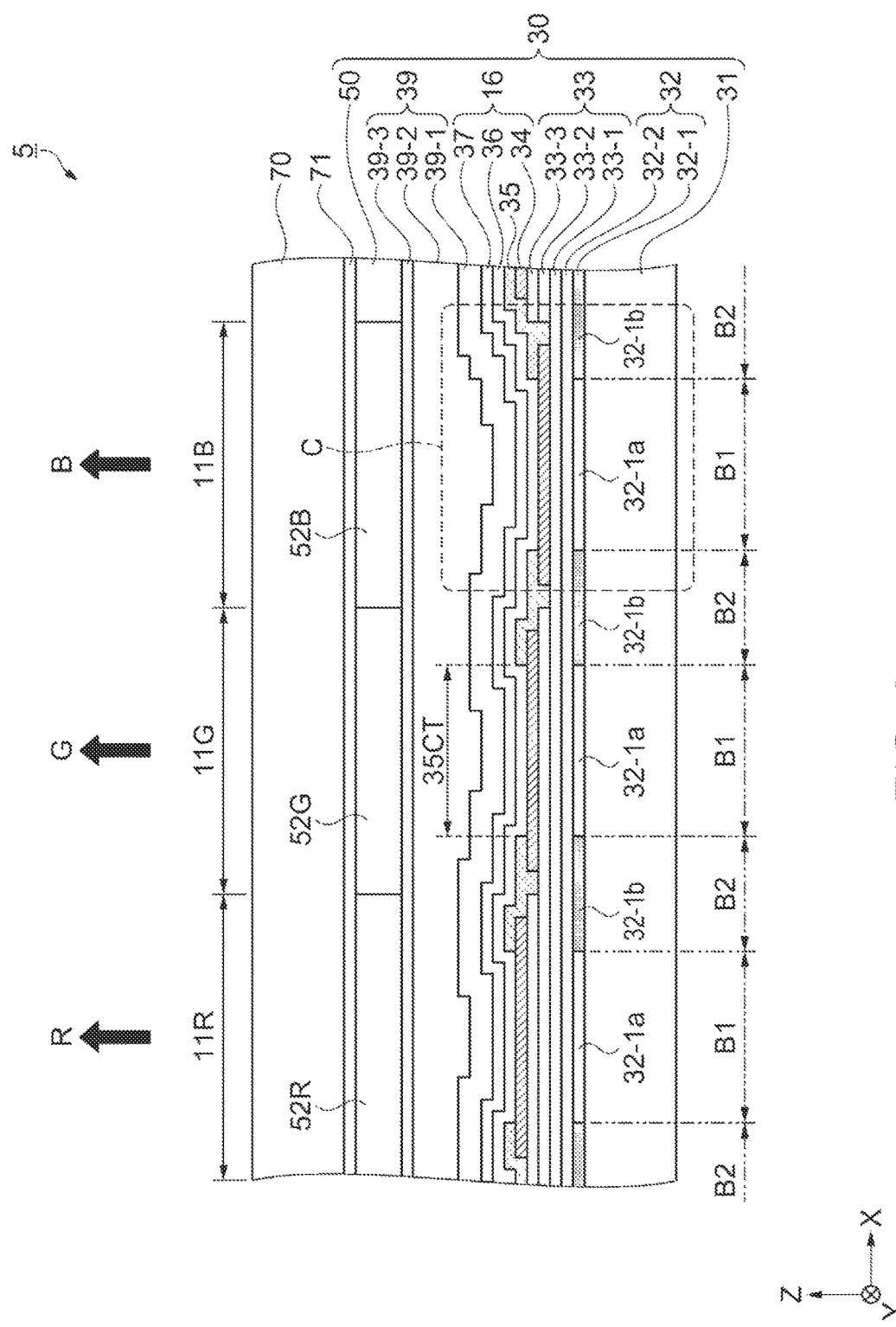
FIG. 3 is a schematic cross-sectional view of a display panel along the line A-A' of the display region in FIG. 1.

FIG. 3 is a schematic cross-sectional view of a display panel along the line A-A' of the display region in FIG. 1. In the drawing, the arrows indicate the states of display light ejected from the respective pixels 11 in the Z direction.

Hereinafter, the outline of the display panel 5 will be described with reference to FIG. 3.

As shown in FIG. 3, in the display panel 5, the element substrate 30, and the sealing substrate 70 are sequentially layered in the Z direction. The light emitted by the display panel 5 is ejected in the Z direction. That is to say, the display panel 5 has a top-emission structure.

In the element substrate 30, an element substrate body 31, a reflection layer 32, an optical distance adjusting layer 33, the pixel electrode 34, an insulating film 35, the light-emitting functional layer 36, the opposing electrode 37, a sealing layer 39, and a color filter 50 are sequentially layered in the Z direction.

The element substrate body 31 is a semiconductor substrate in which the scanning lines 21, the data lines 22, the power supply lines 23, the scanning line driving circuit 24, the data line driving circuit 25, the switching transistors 13, the holding capacitors 15, the drive transistors 14, and the like (see FIG. 2) are formed on a silicon substrate using a known art.

Note that the element substrate body 31 may have a configuration in which signal lines, thin-film transistors, and the like are formed on a light-transmissive substrate such as a quartz substrate or a glass substrate.

The reflection layer 32 is one of the pair of reflection layers between which the light emitted by the light-emitting functional layer 36 is reflected, as described later. The reflection layer 32 is disposed throughout the entire display region 10 across the plurality of pixels 11. Although not shown, the reflection layer 32 has an opening in each pixel 11, and a contact that electrically connects the drive transistor 14 and the pixel electrode 34 is formed inside the opening.

The optical distance adjusting layer 33 is an insulating layer made of light-transmissive insulating material. The optical distance adjusting layer 33 of the R pixel 11R is configured by a first insulating film 33-1, a second insulating film 33-2, and a third insulating film 33-3 that are sequentially layered in the Z (+) direction. The optical distance adjusting layer 33 of the G pixel 11G is configured by the first insulating film 33-1 and the second insulating film 33-2 that are sequentially layered in the Z (+) direction. The optical distance adjusting layer 33 of the B pixel 11B is configured by the first insulating film 33-1.

That is to say, the first insulating film 33-1 is disposed across the R pixel 11R, the G pixel 11G, and the B pixel 11B. The second insulating film 33-2 is disposed across the R pixel 11R and the G pixel 11G. The third insulating film 33-3 is disposed in the R pixel 11R. As a result, the film thickness of the optical distance adjusting layer 33 decreases in order of the R pixel 11R, the G pixel 11G, and the B pixel 11B.

In this embodiment, the first insulating film 33-1 is made of silicon nitride, and the second insulating film 33-2 and the third insulating film 33-3 are made of silicon oxide.

The pixel electrode 34 is an electrode for supplying holes to the light-emitting functional layer 36. The pixel electrode 34 is light-transmissive, is made of a light-transmissive material such as indium tin oxide (ITO), overlaps the reflection layer 32 when viewed from above, and is disposed in the shape of an island in each pixel 11.

The insulating film 35 is a light-transmissive insulating film made of silicon oxide ($SiO_2$), silicon nitride (SiN), or the like, and is formed so as to cover the peripheral edge portion of the pixel electrode 34. The insulating film 35 has an opening 35CT from which the pixel electrode 34 is exposed in each pixel 11. The opening 35CT overlaps part of the pixel electrode 34. The pixel electrode 34 in the portion exposed from the opening 35CT is in contact with the light-emitting functional layer 36, and supplies holes to the light-emitting functional layer 36, so that the light-emitting functional layer 36 emits light. That is to say, the region where the opening 35CT is formed is the light-emitting region of the pixel 11. In this manner, the insulating film 35 plays a role of defining the light-emitting region of the pixel 11 and of providing electrical insulation between adjacent pixel electrodes 34.

B1 in FIG. 3 indicates a region provided with the opening 35CT, and is referred to as an opening region B1 in the description below. Further, B2 in FIG. 3 indicates a region not provided with the opening 35CT, and is referred to as a non-opening region B2 in the description below.

The light-emitting functional layer 36 is formed so as to cover the display region 10. The light-emitting functional layer 36 has an organic light-emitting layer that emits red, green, and blue light. The organic light-emitting layer may be configured by a single layer, or may be configured by a plurality of layers (e.g., a blue light-emitting layer that mainly emits blue light when a current flows therethrough, and a yellow light-emitting layer that emits red and green light when a current flows therethrough). Although not shown, the light-emitting functional layer 36 may have layers such as a hole transport layer, a hole implantation layer, an electron block layer, a hole block layer, an electron transport layer, and an electron implantation layer, in addition to the organic light-emitting layer.

The opposing electrode 37 is disposed so as to cover the display region 10, and is an electrode for supplying electrons to the light-emitting functional layer 36. The opposing electrode 37 is the other of the pair of reflection layers between which the light emitted by the light-emitting functional layer 36 is reflected. The opposing electrode 37 is made of Mg—Ag alloy, for example, and is light-transmissive and light-reflective.

In this manner, the element substrate 30 has a pair of reflection layers (the reflection layer 32 and the opposing electrode 37) between which the light emitted by the light-emitting functional layer 36 is reflected. The light-transmissive members (the optical distance adjusting layer 33, the pixel electrode 34, and the light-emitting functional layer 36) are arranged between the reflection layer 32 and the opposing electrode 37. The optical distance between the reflection layer 32 and the opposing electrode 37 is set to an optical path length that allows light in a specific wavelength range to resonate in each pixel 11. Specifically, the optical distance of the light-transmissive members (the optical distance adjusting layer 33, the pixel electrode 34, and the light-emitting functional layer 36) is set to an optical path length that allows red (R) light to resonate in the R pixel 11R, an optical path length that allows green (G) light to resonate in the G pixel 11G, and an optical path length that allows blue (B) light to resonate in the B pixel 11B, by adjusting the film thickness of the optical distance adjusting layer 33.

As a result, red (R) light is ejected as display light in the Z direction from the R pixel 11R. Green (G) light is ejected as display light in the Z direction from the G pixel 11G. Blue (B) light is ejected as display light in the Z direction from the B pixel 11B.

The sealing layer 39 is configured by a first sealing layer 39-1, a flattening layer 39-2, and a second sealing layer 39-3 that are sequentially layered from the opposing electrode 37 side. The sealing layer 39 covers the light-emitting elements 16, and is disposed substantially throughout the entire element substrate 30.

The first sealing layer 39-1 and the second sealing layer 39-3 are made of, for example, silicon oxynitride obtained by known plasma chemical vapor deposition (CVD) method or the like, and have high barrier properties against water and oxygen.

The flattening layer 39-2 is made of a material having excellent thermal stability, such as epoxy-based resin or coat-type inorganic material (silicon oxide, etc.). The flattening layer 39-2 covers defects (pinholes or cracks) in the first sealing layer 39-1, foreign substances thereon, and the like, thereby forming a flat face.

The color filter 50 is formed on the sealing layer 39. The color filter 50 is configured by a red coloring layer 52R provided in the R pixel 11R, a green coloring layer 52G provided in the G pixel 11G, and a blue coloring layer 52B provided in the B pixel 11B.

A resin layer 71 plays a role of bonding the element substrate 30 and the sealing substrate 70, and may be made of, for example, epoxy resin or acrylic resin.

The sealing substrate 70 is a light-transmissive insulating substrate that may be a quartz substrate, a glass substrate, or the like. The sealing substrate 70 plays a role of providing protection such that the light-emitting elements 16 arranged in the display region 10 are not damaged.

Characteristics of the Display Panel

Figure 4:
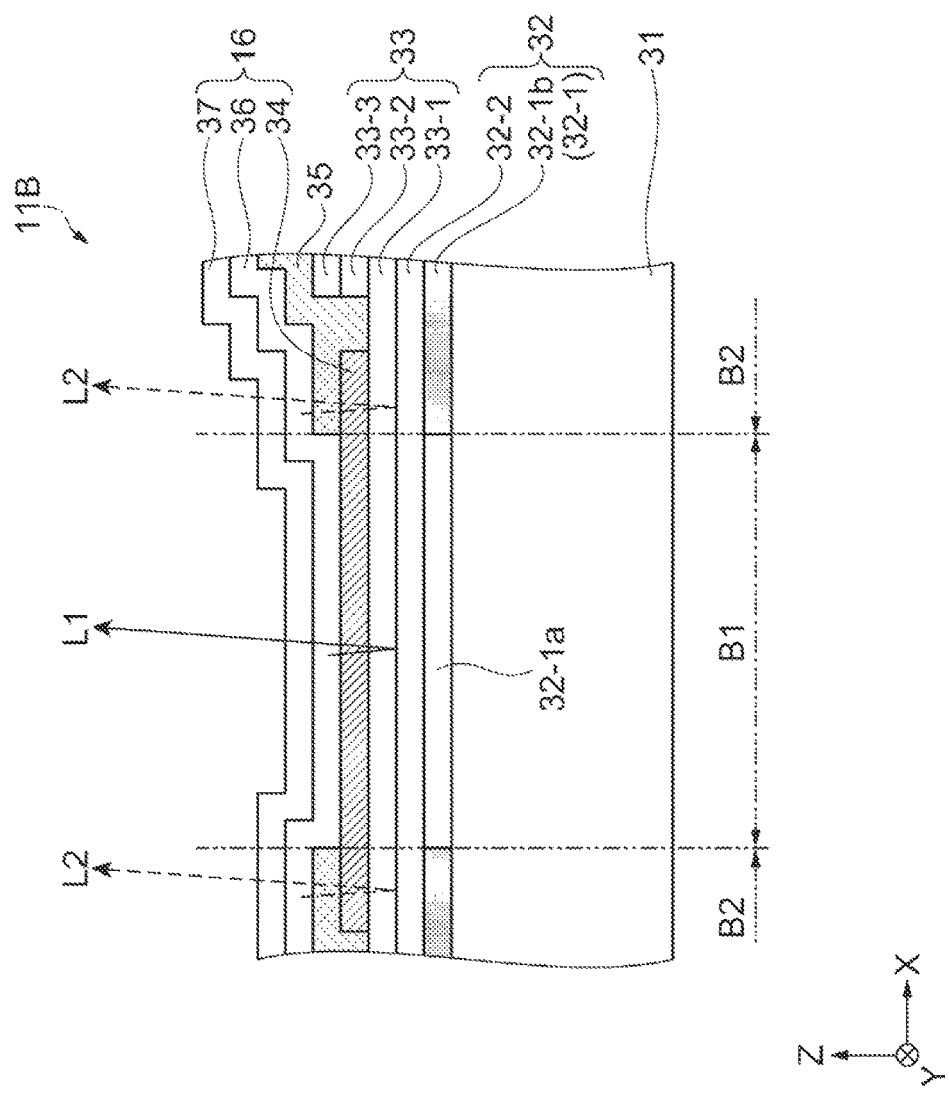
FIG. 4 is a schematic cross-sectional view of the region C enclosed by the broken line in FIG. 3.

FIG. 4 is a schematic cross-sectional view of the region C enclosed by the broken line in FIG. 3, that is, a schematic cross-sectional view of a pixel that emits blue light. In FIG. 4, the sealing layer 39 is not shown. The solid arrow in FIG. 4 indicates the state of display light L1 that is amplified to have a specific wavelength in the opening region B1. The broken arrows in FIG. 4 indicate the state of display light L2 that is amplified to have a specific wavelength in the non-opening region B2.

Hereinafter, the characteristics of the display panel 5 will be described in detail with reference to FIG. 4.

The display panel 5 (the display apparatus 1) is characterized by the reflection layer 32.

As shown in FIG. 4, the reflection layer 32 is configured by an underlayer film 32-1 and a reflection film 32-2 that are sequentially layered in the Z direction. Furthermore, the underlayer film 32-1 is configured by a first underlayer film 32-1a and a second underlayer film 32-1b. The first underlayer film 32-1a is disposed in the opening region B1. The second underlayer film 32-1b is disposed in the non-opening region B2. The reflection film 32-2 is disposed in both of the opening region B1 and the non-opening region B2 so as to cover the underlayer film 32-1.

In this manner, the underlayer film 32-1 and the reflection film 32-2 sequentially layered in the Z direction form the reflection layer 32 disposed throughout the entire display region 10 across the plurality of pixels 11.

The pixel electrode 34 is disposed in the shape of an island in each pixel 11. The light-emitting functional layer 36 and the opposing electrode 37 are arranged throughout the entire display region 10 across the plurality of pixels 11.

In the opening region B1, the voltage Vp of the pixel electrode 34 is transmitted in the Z direction and a direction that intersects the Z direction. When the voltage Vp of the pixel electrode 34 transmitted in the Z direction becomes larger than the threshold voltage Vth, the light-emitting functional layer 36 disposed inside the opening region B1 emits light. When the voltage Vp of the pixel electrode 34 transmitted in a direction that intersects the Z direction becomes larger than the threshold voltage Vth, the light-emitting functional layer 36 disposed in the non-opening region B2, that is, the light-emitting functional layer 36 in the peripheral edge portion of the opening region B1 emits light.

In this manner, when the voltage Vp of the pixel electrode 34 increases, not only the light-emitting functional layer 36 disposed inside the opening region B1 but also the light-emitting functional layer 36 disposed in the peripheral edge portion of the opening region B1 emits light. In the peripheral edge portion of the opening region B1 (the non-opening region B2), the brightness of the light emitted by the light-emitting functional layer 36 increases toward the opening region B1.

In the opening region B1, light-transmissive members including the optical distance adjusting layer 33, the pixel electrode 34, and the light-emitting functional layer 36 are arranged between the reflection layer 32 and the opposing electrode 37. In the peripheral edge portion of the opening region B1 (the non-opening region B2), light-transmissive members including the optical distance adjusting layer 33, the pixel electrode 34, the insulating film 35, and the light-emitting functional layer 36 are arranged between the reflection layer 32 and the opposing electrode 37. Accordingly, the optical path length (film thickness) of the light-transmissive members in the peripheral edge portion of the opening region B1 (the non-opening region B2) is larger than that in the opening region B1.

In the B pixel 11B, the optical distance of the light-transmissive members (the optical distance adjusting layer 33, the pixel electrode 34, and the light-emitting functional layer 36) between the reflection layer 32 and the opposing electrode 37 in the opening region B1 is set to an optical path length that allows blue (B) light to resonate. Accordingly, the light emitted by the light-emitting functional layer 36 in the opening region B1 is repeatedly reflected between the reflection layer 32 and the opposing electrode 37, and is ejected in the Z direction as the display light L1 in a state where the light having a specific wavelength (blue (B) light) has been amplified.

As described above, the optical path length (film thickness) of the light-transmissive members in the peripheral edge portion of the opening region B1 (the non-opening region B2) is larger than that in the opening region B1. Accordingly, in the B pixel 11B, the light emitted by the light-emitting functional layer 36 in the peripheral edge portion of the opening region B1 is repeatedly reflected between the reflection film 32-2 and the opposing electrode 37, and is ejected in the Z direction as the display light L2 in a state where the light has been amplified to have a wavelength longer than that of the display light L1 (blue (B) light) of the opening region B1. That is to say, in the peripheral edge portion of the opening region B1 (the non-opening region B2), the display light L2 having a wavelength longer than that of the display light L1 is emitted. Accordingly, the color purity (color) of the light (blue (B) light) emitted from the B pixel 11B changes.

Also in the R pixel 11R and the G pixel 11G, the light-emitting functional layer 36 in the peripheral edge portion of the opening region B1 (the non-opening region B2) emits light in a manner similar to that of the B pixel 11B. In the R pixel 11R in the non-opening region B2, the display light L2 having a wavelength longer than that of the red (R) light is emitted, and the color purity (color) of the red (R) light emitted from the R pixel 11R changes. In the G pixel 11G in the non-opening region B2, the display light L2 having a wavelength longer than that of the green (G) light is emitted, and the color purity (color) of the green (G) light emitted from the G pixel 11G changes.

As described above, in the reflection layer 32 in the opening region B1, the first underlayer film 32-1a and the reflection film 32-2 are layered. In the reflection layer 32 in the non-opening region B2, the second underlayer film 32-1b and the reflection film 32-2 are layered. The first underlayer film 32-1a is made of titanium. The second underlayer film 32-1b is made of titanium nitride or titanium oxide. The reflection film 32-2 is made of aluminum or alloy containing aluminum as a main component.

That is to say, the reflection layer 32 in the opening region B1 has a configuration in which titanium and aluminum or alloy containing aluminum as a main component are layered. The reflection layer 32 in the non-opening region B2 has a configuration in which titanium nitride or titanium oxide and aluminum or alloy containing aluminum as a main component are layered.

Although described later in detail, with this configuration, the reflectance of the reflection layer 32 in the non-opening region B2 can be made lower than that of the reflection layer 32 in the opening region B1. That is to say, the reflection layer 32 in the opening region B1 has high reflectance, and the reflection layer 32 in the non-opening region B2 has low reflectance.

Note that the reflection layer 32 in the portion in which the first underlayer film 32-1a and the reflection film 32-2 are layered is a "reflection layer in a high reflectance portion" in the invention. The reflection layer 32 in the portion in which the second underlayer film 32-1b and the reflection film 32-2 are layered is a "reflection layer in a low reflectance portion" in the invention.

In the non-opening region B2, the reflectance of the reflection layer 32 is lower than that in the opening region B1, and, thus, the light is repeatedly reflected between the reflection layer 32 and the opposing electrode 37, the brightness of the display light L2 ejected in the Z direction is lowered, and the change in the color purity (color) of the light (the display light L1) emitted from the pixel 11 is reduced.

The reflection layer 32 in the portion in which the first underlayer film 32-1a and the reflection film 32-2 are layered, that is, the reflection layer 32 in the high reflectance portion is preferably disposed in at least part of the opening region B1. If the reflection layer 32 in the high reflectance portion is disposed so as to extend into the non-opening region B2, the brightness of the display light L2 ejected in the Z direction in the non-opening region B2 increases, and the change in the color purity (color) of the light (the display light L1) emitted from the pixel 11 increases, which is not preferable.

In this manner, the display apparatus 1 (the display panel 5) has the pixels 11 in which the reflection layer 32, the optical distance adjusting layer 33, the pixel electrode 34, the insulating film 35, the light-emitting functional layer 36, and the opposing electrode 37 are sequentially layered in the Z direction. The insulating film 35 has the opening 35CT from which the pixel electrode 34 is exposed. The opening 35CT overlaps part of the pixel electrode 34. The reflection layer 32 is disposed across the plurality of pixels 11, and has a high reflectance portion and a low reflectance portion. The reflection layer 32 in the high reflectance portion is disposed in at least part of the opening region B1.

Moreover, the reflection layer 32 has the underlayer film 32-1 and the reflection film 32-2 sequentially layered in the Z direction. The underlayer film 32-1 (the first underlayer film 32-1a) in the high reflectance portion is made of titanium. The underlayer film 32-1 (the second underlayer film 32-1b) in the low reflectance portion is made of titanium nitride or titanium oxide. The reflection film 32-2 is made of aluminum or alloy containing aluminum as a main component.

With this configuration, the adverse effect (change in the color) caused by the light-emitting functional layer 36 in the peripheral edge portion of the opening region B1 (the non-opening region B2) emitting light can be reduced. Thus, display with high image quality can be provided.

Reflection Characteristics of the Reflection Layer

Figure 5:
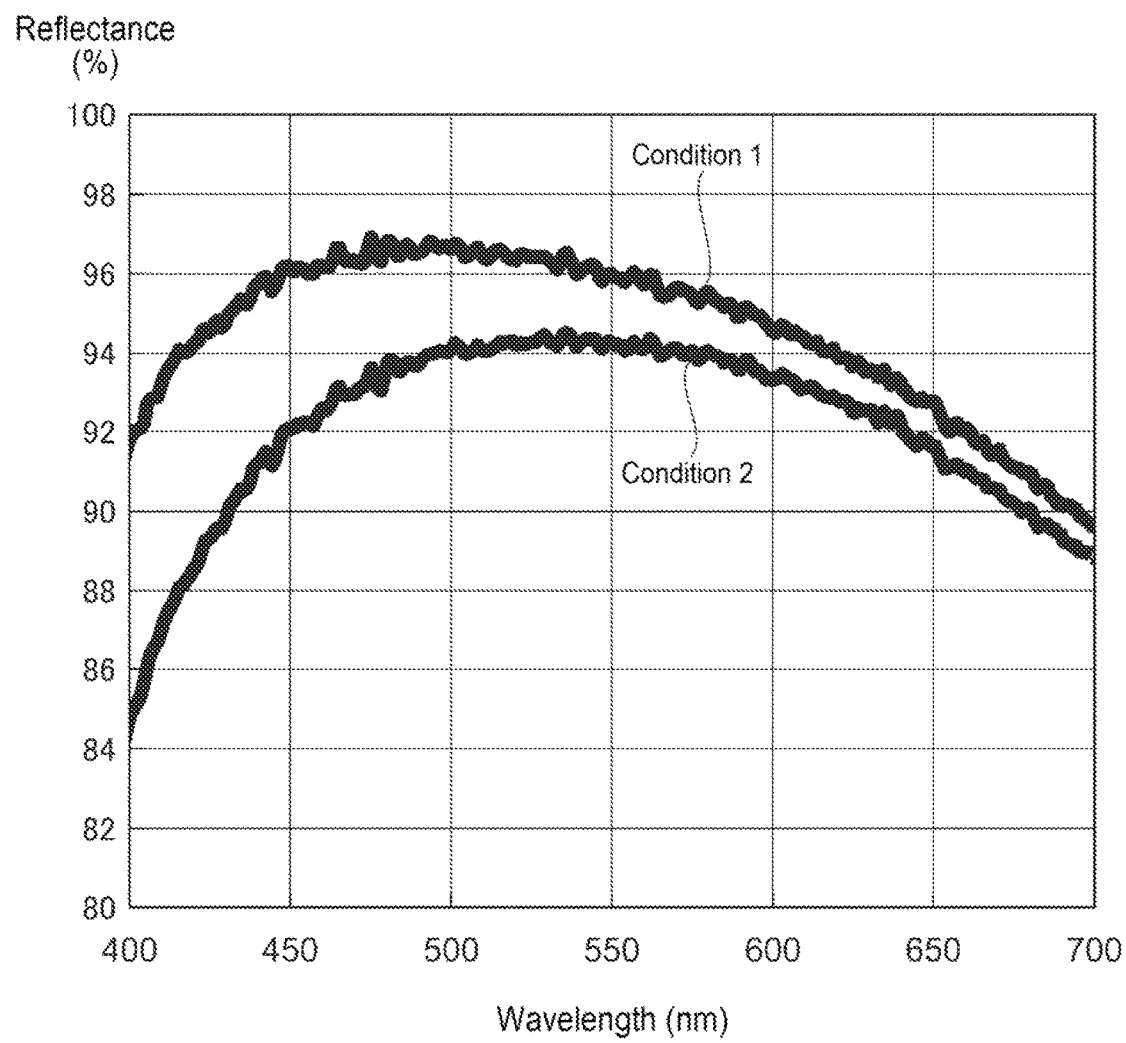
FIG. 5 is a graph showing a relationship between the wavelength of light and the reflectance of light in the structure in which a reflection layer and an optical distance adjusting layer are layered.
Figure 6A:
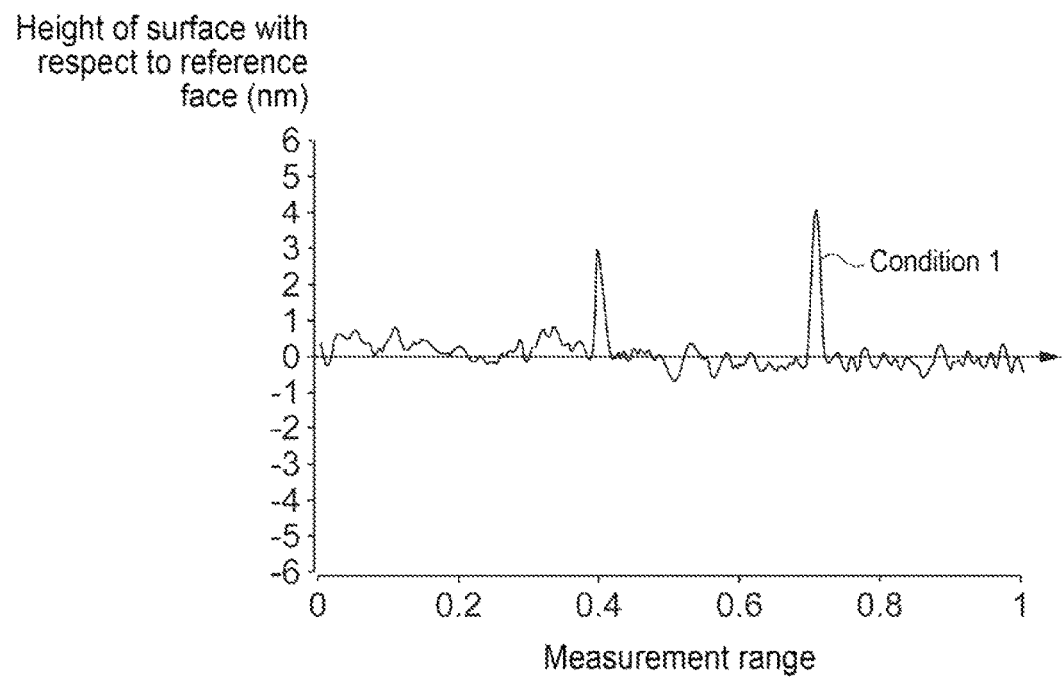
FIGS. 6A and 6B are graphs showing states of the surface shape in the structure in which the reflection layer and the optical distance adjusting layer are layered.
Figure 6B:
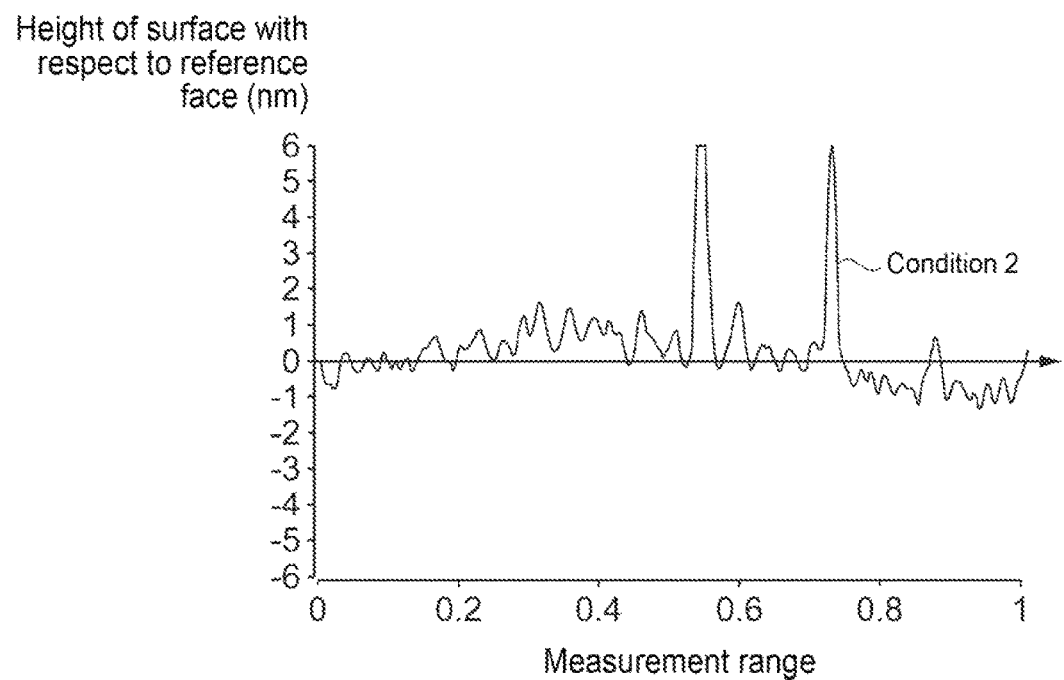

FIG. 5 is a graph showing a relationship between the wavelength of light and the reflectance of light in the structure in which the reflection layer and the optical distance adjusting layer are layered. FIGS. 6A and 6B are graphs showing states of the surface shape in the structure in which the reflection layer and the optical distance adjusting layer are layered.

In FIG. 5, the vertical axis indicates the reflectance of light, and the horizontal axis indicates the wavelength of light. The reflectance is a percentage of the brightness of light reflected in the Z direction with respect to the brightness of light incident in the Z direction. FIGS. 6A and 6B show surface shapes measured using a light interference microscope, where the vertical axis indicates the height (dimension in the Z direction) of the surface with respect to the reference face, and the horizontal axis indicates the measurement range (length in a direction that intersects the Z direction). The horizontal axis is normalized so that the maximum measurement range is taken as 1.

Condition 1 in FIGS. 5 and 6A has a configuration in which the first underlayer film 32-1a (titanium), the reflection film 32-2 (aluminum or alloy containing aluminum as a main component), and the first insulating film 33-1 (silicon nitride) are sequentially layered. That is to say, Condition 1 corresponds to the opening region B1 in the B pixel 11B.

Condition 2 in FIGS. 5 and 6B has a configuration in which the second underlayer film 32-1*b* (titanium nitride or titanium oxide), the reflection film 32-2 (aluminum or alloy containing aluminum as a main component), and the first insulating film 33-1 (silicon nitride) are sequentially layered. That is to say, Condition 2 corresponds to the non-opening region B2 in the B pixel 11B.

As shown in FIG. 5, the reflectance (the reflectance of the reflection layer 32 in the non-opening region B2) in the structure in Condition 2 is smaller than the reflectance (the reflectance of the reflection layer 32 in the opening region B1) in the structure in Condition 1.

As shown in FIGS. 6A and 6B, the maximum surface roughness of the structure in Condition 2 is larger than 6 nm. The maximum surface roughness of the structure in Condition 1 is about 3 to 4 nm. That is to say, the structure in Condition 2 has a surface roughness larger than that of the structure in Condition 1. It seems that this difference in the surface roughness causes the difference in the reflectance shown in FIG. 5. That is to say, since the structure in Condition 2 has a surface roughness larger than that of the structure in Condition 1, diffused reflection of light easily occurs, so that the brightness of the light (reflected light) reflected in the Z direction is lowered.

Although not shown, the reflectance of the structure in which no first insulating film 33-1 is provided and the first underlayer film 32-1*a* and the reflection film 32-2 are layered is similar to that of the structure in Condition 1 (structure in which the first underlayer film 32-1*a*, the reflection film 32-2, and the first insulating film 33-1 are layered).

That is to say, even when the first insulating film 33-1 is formed on the reflection layer 32 in which the first underlayer film 32-1*a* and the reflection film 32-2 are layered, the reflectance of the reflection layer 32 does not change, and the high reflectance is maintained. On the other hand, if the first insulating film 33-1 is formed on the reflection layer 32 in which the second underlayer film 32-1*b* and the reflection film 32-2 are layered, the reflectance of the reflection layer 32 is lowered.

In Condition 1, the reflection film 32-2 made of aluminum or alloy containing aluminum as a main component is layered on the first underlayer film 32-1*a* made of titanium. In Condition 2, the reflection film 32-2 made of aluminum or alloy containing aluminum as a main component is layered on the second underlayer film 32-1*b* made of titanium nitride or titanium oxide.

The reflection film 32-2 is obtained by film formation with aluminum or alloy containing aluminum as a main component using a sputtering method. The film formation temperature is about 100 to 200° C. The first insulating film 33-1 is obtained by film formation with silicon nitride using a plasma CVD method. The film formation temperature with silicon nitride is about 400 to 600° C.

In Condition 1, it seems that titanium forming the first underlayer film 32-1*a* is diffused toward the reflection film 32-2 due to heat treatment performed in film formation with aluminum or alloy containing aluminum as a main component (about 100 to 200° C.) or heat treatment performed in film formation with silicon nitride (about 400 to 600° C.), so that the reflection film 32-2 is changed into an alloy containing titanium. As a result, the occurrence of hillocks, voids, and the like in the reflection film 32-2 due to heat treatment performed in formation of the first insulating film 33-1 (about 400 to 600° C.), stress of the first insulating film 33-1, or the like is suppressed. Thus, the changes in the reflectance and the surface roughness are suppressed as shown in FIGS. 5, 6A, and 6B.

In this manner, if the first underlayer film 32-1*a* made of titanium is disposed under the reflection film 32-2 made of aluminum or alloy containing aluminum as a main component, the occurrence of hillocks and voids in the reflection film 32-2 is suppressed. Thus, even when the first insulating film 33-1 is formed on the reflection film 32-2, the high reflectance of the reflection film 32-2 is maintained.

In Condition 2, it seems that, since the second underlayer film 32-1*b* is made of titanium nitride or titanium oxide, titanium is less likely to be diffused toward the reflection film 32-2 due to heat treatment performed in film formation with aluminum or alloy containing aluminum as a main component (about 100 to 200° C.) or heat treatment performed in film formation with silicon nitride (about 400 to 600° C.). That is to say, the reflection film 32-2 in Condition 2 is kept in a state (state as deposited) of aluminum or alloy containing aluminum as a main component, and hillocks, voids, and the like easily occur in the reflection film 32-2 due to heat treatment performed in formation of the first insulating film 33-1 (about 400 to 600° C.), stress of the first insulating film 33-1, or the like. Thus, the reflectance is lowered, and the surface roughness increases, as shown in FIGS. 5, 6A, and 6B.

In this manner, if the second underlayer film 32-1*b* made of titanium nitride or titanium oxide is disposed under the reflection film 32-2 made of aluminum or alloy containing aluminum as a main component, hillocks and voids easily occur in the reflection film 32-2. Thus, it seems that, if the first insulating film 33-1 is formed on the reflection film 32-2, the surface roughness of the reflection layer 32 increases, and the reflectance of the reflection layer 32 is lowered.

In this manner, the inventor found that the change in the reflectance of the reflection film 32-2 (the reflection layer 32) varies depending on a material forming the underlayer film 32-1 that is provided under the reflection film 32-2.

That is to say, if the first underlayer film 32-1*a* made of titanium is provided under the reflection film 32-2, even when the first insulating film 33-1 is formed on the reflection film 32-2, the reflectance of the reflection layer 32 is less likely to change, and the high reflectance is maintained. Accordingly, it is possible to solve the problem of the known technique (JP-A-2013-165014) that, in the case of forming an insulating layer on a reflection film made of aluminum or alloy containing aluminum as a main component, the brightness of the display light reflected by the reflection film is lowered.

Moreover, if the second underlayer film 32-1*b* made of titanium nitride or titanium oxide is provided under the reflection film 32-2, the reflection layer 32 changes to have a lower reflectance. Accordingly, the reflection of light in the non-opening region B2 is reduced, and the adverse effect (change in the color) caused by the light-emitting functional layer 36 in the non-opening region B2 emitting light can be reduced. Thus, display with high image quality can be provided.

Embodiment 2

Outline of the Display Panel

Figure 7:
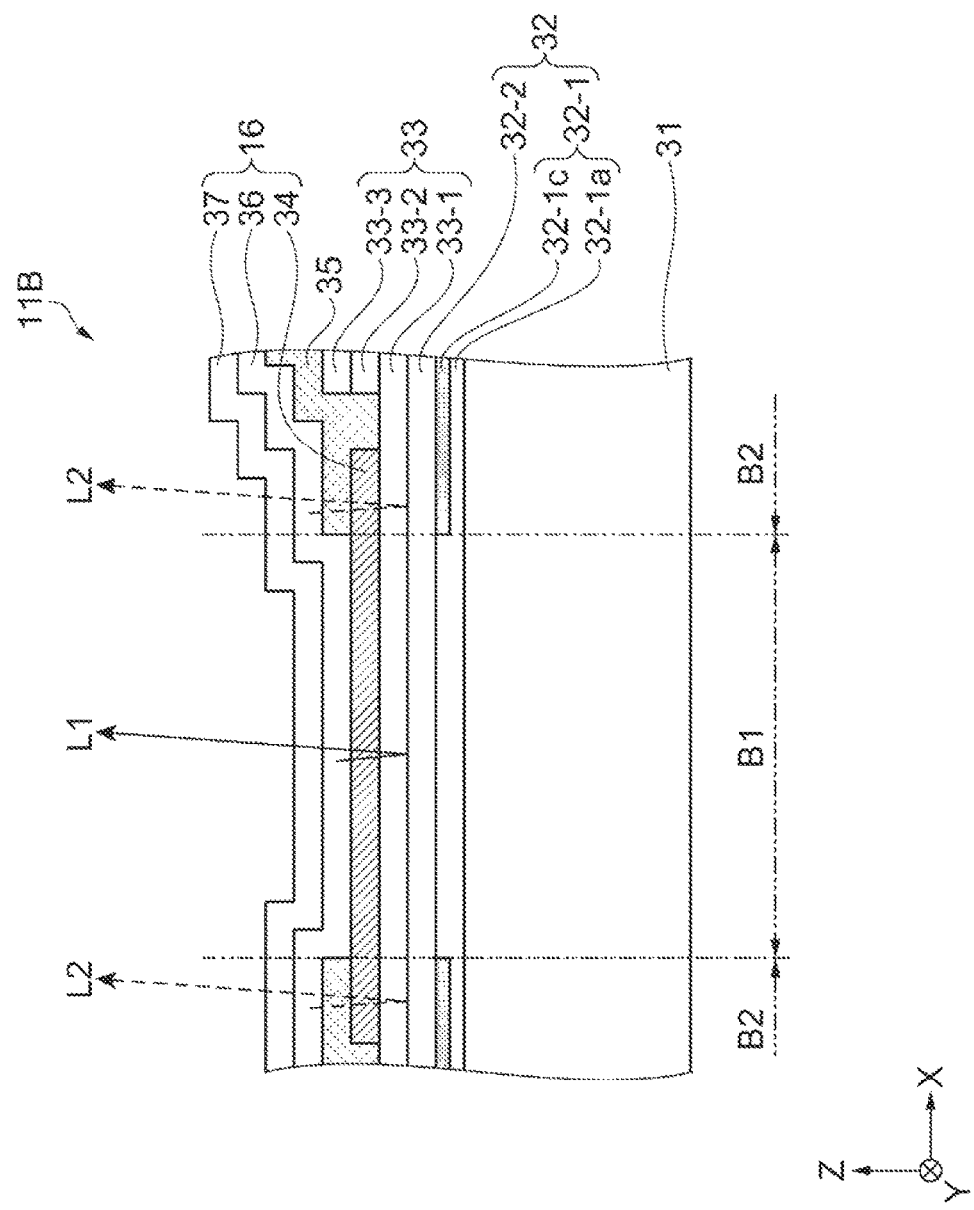
FIG. 7 is a schematic cross-sectional view of the display panel according to Embodiment 2.

FIG. 7 is a schematic cross-sectional view of the display panel according to Embodiment 2, corresponding to FIG. 4.

Hereinafter, the outline of the display panel according to this embodiment will be described with reference to FIG. 7, mainly focusing on differences from Embodiment 1. Note that the same constituent elements as those in Embodiment 1 are denoted by the same reference numerals, and redundant description thereof has been omitted.

This embodiment is the same as Embodiment 1, except for the configuration of the underlayer film 32-1.

As shown in FIG. 7, the reflection layer 32 is configured by the underlayer film 32-1 and the reflection film 32-2 that are sequentially layered in the Z direction. The underlayer film 32-1 is configured by the first underlayer film 32-1a and a third underlayer film 32-1c.

The first underlayer film 32-1a is made of titanium, and is disposed in both of the opening region B1 and the non-opening region B2, that is, throughout the entire display region 10. The third underlayer film 32-1c is made of nitrogen-introduced titanium (titanium nitride), and is disposed on the first underlayer film 32-1a in the non-opening region B2 (Z (+) direction).

That is to say, the underlayer film 32-1 in the non-opening region B2 is configured by the first underlayer film 32-1a made of titanium and the third underlayer film 32-1c made of nitrogen-introduced titanium (titanium nitride). The underlayer film 32-1 in the opening region B1 is configured by the first underlayer film 32-1a made of titanium. This embodiment is different from Embodiment 1 in this aspect.

In the non-opening region B2, if the underlayer film 32-1 is configured such that the side thereof in contact with the reflection film 32-2 is the third underlayer film 32-1c made of nitrogen-introduced titanium (titanium nitride), titanium is less likely to be diffused toward the reflection film 32-2 due to heat treatment performed in film formation with aluminum (about 100 to 200° C.) or heat treatment performed in formation of the first insulating film 33-1 (heat treatment at about 400 to 600° C.). Thus, the change of the reflection film 32-2 into an alloy containing titanium is suppressed. Accordingly, if the first insulating film 33-1 is formed on the reflection film 32-2, hillocks, voids, and the like easily occur in the reflection film 32-2 due to heat treatment performed in formation of the first insulating film 33-1 (about 400 to 600° C.), stress of the first insulating film 33-1, or the like. Thus, the reflectance of the reflection layer 32 in the non-opening region B2 is lowered.

Accordingly, the reflection of light in the non-opening region B2 is reduced, and the adverse effect (change in the color) caused by the light-emitting functional layer 36 in the non-opening region B2 emitting light can be reduced. Thus, display with high image quality can be provided. That is to say, it is possible to achieve the same effects as those in Embodiment 1 in which the underlayer film 32-1 in the non-opening region B2 is the second underlayer film 32-1b made of titanium nitride or titanium oxide.

Method for Manufacturing the Display Panel

Figure 8:
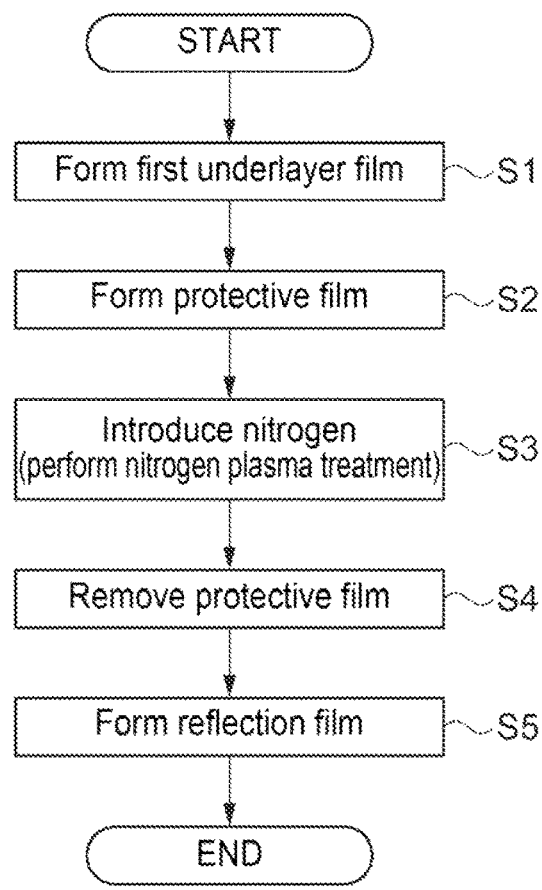
FIG. 8 is a processing flow illustrating a method for manufacturing the display panel according to the embodiment.

FIG. 8 is a processing flow illustrating a method for manufacturing the display panel according to this embodiment. FIGS. 9A to 9E are schematic cross-sectional views showing states after the respective processing shown in FIG. 8, corresponding to FIG. 3.

Hereinafter, the outline of the method for manufacturing the display panel will be described with reference to FIGS. 8 and 9A to 9E.

As shown in FIG. 8, the process that manufactures the display panel 5 according to this embodiment includes forming the first underlayer film 32-1a (step S1), forming a protective film 41 (step S2), introducing nitrogen to the first underlayer film 32-1a (step S3), removing the protective film 41 (step S4), and forming the reflection film 32-2 (step S5).

Figure 9A:
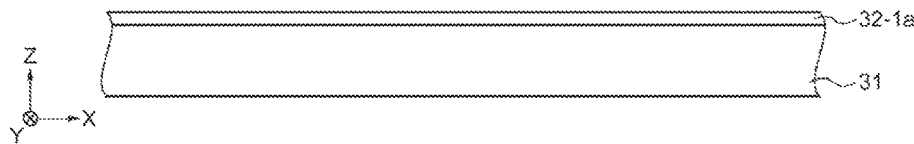
FIGS. 9A to 9E are schematic cross-sectional views showing states after the respective processing.

In step S1, as shown in FIG. 9A, for example, film formation with titanium is performed on the element substrate body 31 using a sputtering method, so that the first underlayer film 32-1a is formed. Since the element substrate body 31 was subjected to flattening treatment, the flat first underlayer film 32-1a is formed on the element substrate body 31 throughout the entire display region 10.

Figure 9B:
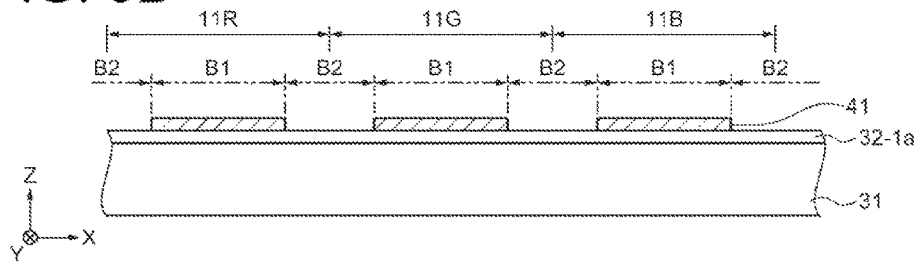

In step S2, as shown in FIG. 9B, for example, silicon oxide film formation is performed on the first underlayer film 32-1a using a plasma CVD method. Then, the silicon oxide formed in the non-opening region B2 is removed, for example, by dry etching using fluorine gas, using photoresist as an etching mask, so that the protective film 41 covering at least part of the opening region B1 is formed. The protective film 41 is formed in the opening regions B1 of the R pixel 11R, the G pixel 11G, and the B pixel 11B. That is to say, the first underlayer film 32-1a in the opening region B1 is covered by the protective film 41, and the first underlayer film 32-1a in the non-opening region B2 is exposed without being covered by the protective film 41.

Figure 9C:
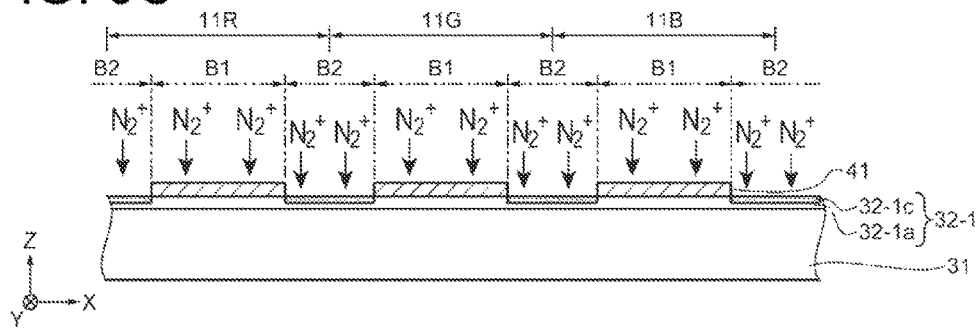

In step S3, as shown in FIG. 9C, the first underlayer film 32-1a in the non-opening region B2 is exposed to plasma of nitrogen gas, so that nitrogen is introduced thereto. Thus, the third underlayer film 32-1c made of nitrogen-introduced titanium (titanium nitride) is formed on the first underlayer film 32-1a. That is to say, the underlayer film 32-1 configured by the first underlayer film 32-1a and the third underlayer film 32-1c is formed in the non-opening region B2.

Specifically, an electron cyclotron resonance (ECR) plasma apparatus is used to convert nitrogen-hydrogen mixture gas into plasma, so that excited species of nitrogen molecules such as $N_2^+$ are generated. Then, the excited species $N_2^+$ of nitrogen molecules are irradiated on the first underlayer film 32-1a in the non-opening region B2. As a result, the surface of the first underlayer film 32-1a in the non-opening region B2 is nitrided, so that the third underlayer film 32-1c made of nitrogen-introduced titanium (titanium nitride) is formed on the first underlayer film 32-1a. Since the first underlayer film 32-1a in the opening region B1 is covered by the protective film 41, no nitrogen is introduced thereto, and the titanium state is maintained.

In step S3, the first underlayer film 32-1a in the non-opening region B2 not covered by the protective film 41 is nitrided, so that the third underlayer film 32-1c made of nitrogen-introduced titanium (titanium nitride) is formed. Since part of the first underlayer film 32-1a (the surface of the first underlayer film 32-1a) is nitrided, a difference in the height that appears at the boundary between the underlayer film 32-1 in the portion thereof where the third underlayer film 32-1c is formed and the underlayer film 32-1 in the portion thereof where the third underlayer film 32-1c is not formed is slight, and, thus, the flatness of the underlayer film 32-1 is not impaired.

An ECR plasma apparatus can provide plasma having higher concentration than that of a plasma apparatus using an RF power source. Thus, introduction of nitrogen to the first underlayer film 32-1a (plasma nitriding) more smoothly progresses. Moreover, hydrogen has an effect of improving the concentration of excited species $N_2^+$ of nitrogen molecules.

Note that a plasma apparatus using a radio frequency (RF) power source may be used in the plasma treatment using nitrogen gas.

Figure 9D:
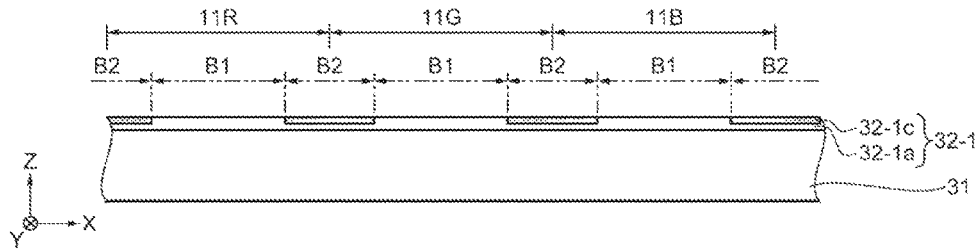

In step S4, as shown in FIG. 9D, for example, the protective film 41 is removed by dry etching using fluorine gas. As a result, the underlayer film 32-1 configured by the first underlayer film 32-1a made of titanium and the third underlayer film 32-1c made of nitrogen-introduced titanium (titanium nitride) is formed in the non-opening region B2, and the underlayer film 32-1 configured by the first underlayer film 32-1a made of titanium is formed in the opening region B1.

Figure 9E:
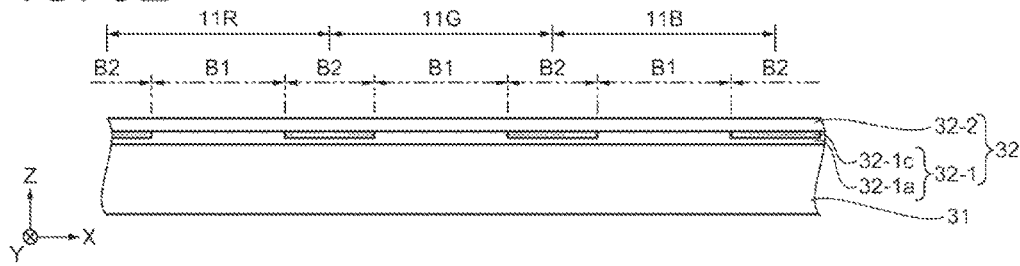

In step S5, as shown in FIG. 9E, for example, film formation with aluminum or alloy containing aluminum as a main component is performed using a sputtering method, so that the reflection film 32-2 is formed. As a result, the reflection layer 32 in which the underlayer film 32-1 and the reflection film 32-2 are layered in the Z direction is formed. Since the underlayer film 32-1 is flat, the reflection layer 32 having excellent flatness can be formed.

Moreover, the first insulating film 33-1 (the optical distance adjusting layer 33), the pixel electrode 34, and the light-emitting functional layer 36 formed on the reflection layer 32 having excellent flatness are also flat and are excellent in the uniformity of the film thickness. That is to say, compared with the known technique (JP-A-2013-165014) in which a reflection layer is patterned in the shape of an island in each pixel, the reflection layer 32 formed by the manufacturing method in this embodiment is excellent in the flatness. Moreover, the uniformity of the optical path length (film thickness) of the light-transmissive members (the optical distance adjusting layer 33, the pixel electrode 34, and the light-emitting functional layer 36) arranged between the reflection layer 32 and the opposing electrode 37 is improved. Accordingly, the uniformity of the resonant wavelength matching the optical path length between the reflection film 32-2 and the opposing electrode 37 can be improved.

Embodiment 3

Figure 10:
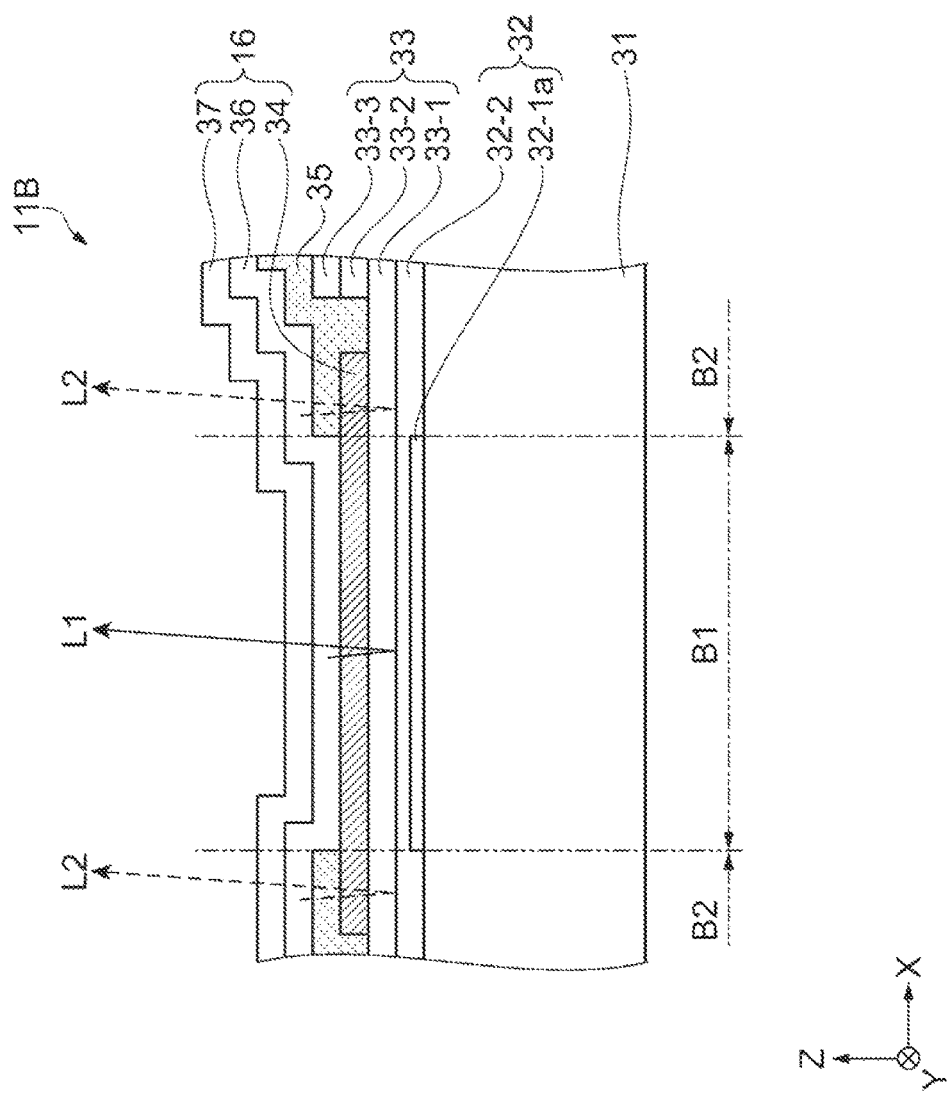
FIG. 10 is a schematic cross-sectional view of the display panel according to Embodiment 3.

FIG. 10 is a schematic cross-sectional view of the display panel according to Embodiment 3, corresponding to FIG. 4.

Hereinafter, the outline of the display panel according to this embodiment will be described with reference to FIG. 10, mainly focusing on differences from Embodiment 1. Note that the same constituent elements as those in Embodiment 1 are denoted by the same reference numerals, and redundant description thereof has been omitted.

This embodiment is the same as Embodiment 1, except for the configuration of the reflection layer 32.

As shown in FIG. 10, the reflection layer 32 in the opening region B1 is configured by the first underlayer film 32-1a and the reflection film 32-2 that are sequentially layered in the Z direction. The reflection layer 32 in the non-opening region B2 is configured only by the reflection film 32-2.

The first underlayer film 32-1a is made of titanium, and is disposed only in the opening region B1. The reflection film 32-2 is made of aluminum or alloy containing aluminum as a main component, and is disposed in both of the opening region B1 and the non-opening region B2, that is, throughout the entire display region 10.

This embodiment is different from Embodiment 1 mainly in that the reflection layer 32 in the non-opening region B2 is made only of aluminum or alloy containing aluminum as a main component.

In the opening region B1, the first underlayer film 32-1a made of titanium is disposed under the reflection film 32-2 made of aluminum or alloy containing aluminum as a main component. Accordingly, the occurrence of hillocks and voids in the aluminum or the alloy containing aluminum as a main component is suppressed. Thus, even when the first insulating film 33-1 is formed on the reflection film 32-2, the high reflectance of the reflection layer 32 in the opening region B1 is maintained.

In the non-opening region B2, only the reflection film 32-2 made of aluminum or alloy containing aluminum as a main component is disposed. Accordingly, hillocks and voids easily occur in the reflection film 32-2 made of aluminum or alloy containing aluminum as a main component due to heat treatment performed in formation of the first insulating film 33-1, stress of the first insulating film 33-1, or the like. Thus, the reflectance of the reflection layer 32 in the non-opening region B2 is lowered. Accordingly, the adverse effect (change in the color) caused by the light-emitting functional layer 36 in the non-opening region B2 emitting light can be reduced.

Embodiment 3

Electronic Device

Figure 11:
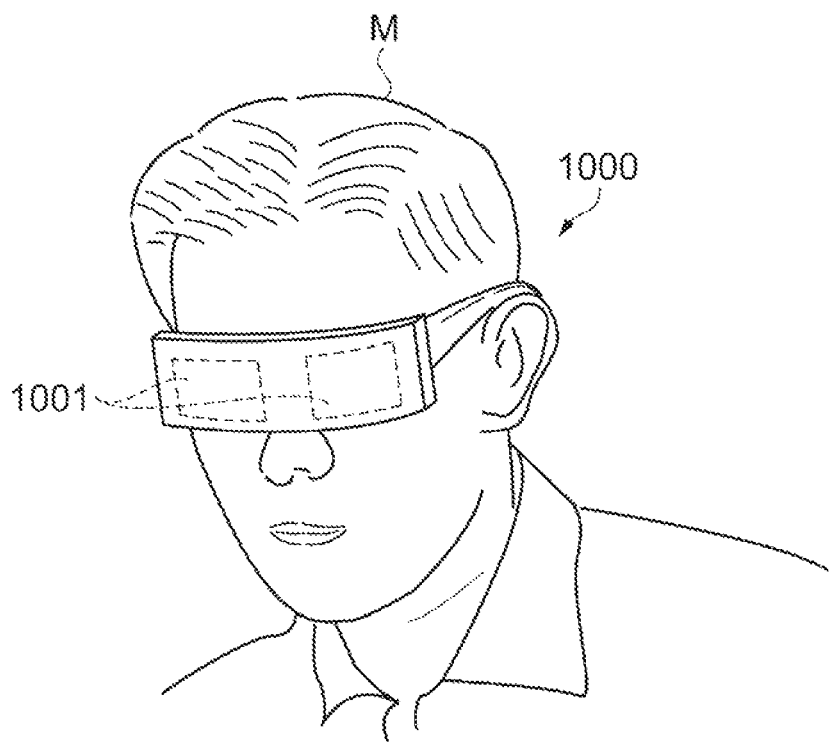
FIG. 11 is a schematic view of a head-mounted display.

FIG. 11 is a schematic view of a head-mounted display as an exemplary electronic device.

As shown in FIG. 11, a head-mounted display 1000 has two display portions 1001 provided corresponding to the left and right eyes. A viewer M who wears the head-mounted display 1000 on the head like glasses can view characters, images, and the like displayed on the display portions 1001. For example, if an image provided in consideration of parallax is displayed on the left and right display portions 1001, three-dimensional video can be enjoyed.

Any one of the display panels and the display apparatuses according to the foregoing embodiments is mounted in the display portions 1001. In the display panels (display apparatuses) according to the foregoing embodiments, the reflectance of the reflection layer 32 in the non-opening region B2 is low and reflection of light in this region is suppressed, and, thus, the adverse effect (change in the color) caused by the light-emitting functional layer 36 in the non-opening region B2 emitting light can be reduced, and display with high image quality can be provided. Accordingly, if any one of the display panels (display apparatuses) according to the foregoing embodiments is mounted in the display portions 1001, a head-mounted display 1000 that realizes display with high image quality can be provided.

The electronic device in which any one of the display panels (display apparatuses) according to the foregoing embodiments is mounted is not limited to the head-mounted display 1000. For example, they may be mounted in other electronic devices having a display portion, such as a head-up display, an electronic viewfinder of a digital camera, a portable information terminal, a navigator, or the like.

The invention is not limited to the forgoing embodiments, and appropriate changes can be made without departing from the gist or the idea of the invention that can be read from the claims or the entire specification. Electro-optical devices with such a change and electronic devices in which those electro-optical devices are mounted are also included in the technical scope of the invention.

Various modified examples other than the foregoing embodiments are conceivable. Hereinafter, modified examples will be described.

Modified Example 1

The introducing nitrogen (step S3) in Embodiment 2 may be converting nitrogen into ions and increasing the speed of the ions using an ion implantation apparatus, thereby implanting the nitrogen into the first underlayer film 32-1*a* (the surface of the first underlayer film 32-1*a*) in the non-opening region B2.

According to the method of converting nitrogen into ions and increasing the speed of the ions, thereby implanting the nitrogen ions into the first underlayer film 32-1*a* in the non-opening region B2, the concentration of nitrogen introduced to the first underlayer film 32-1*a* is gradually lowered in the depth direction. That is to say, the concentration of nitrogen is high on the side on which nitrogen ions are irradiated (the surface of the first underlayer film 32-1*a*), and the concentration of nitrogen is lowered away from the side on which nitrogen ions are irradiated.

Also with this configuration, it is possible to achieve the same effects as those in Embodiment 2 in which titanium is less likely to be diffused toward the reflection film 32-2 due to heat treatment performed in formation of the reflection film 32-2 or the first insulating film 33-1.

Modified Example 2

The introducing nitrogen (step S3) in Embodiment 2 may be performing heat treatment in nitrogen-containing gas. The first underlayer film 32-1*a* (the surface of the first underlayer film 32-1*a*) in the non-opening region B2 can be nitrided also by performing heat treatment in nitrogen-containing gas.

In this manner, the introducing nitrogen (step S3) in Embodiment 2 may be any process as long as titanium nitride or nitrogen-containing titanium can be formed on the side in contact with the reflection film 32-2.

Modified Example 3

The introducing nitrogen (step S3) in Embodiment 2 may be introducing oxygen instead of nitrogen. That is to say, oxygen may be introduced to the first underlayer film 32-1*a* (the surface of the first underlayer film 32-1*a*) in the non-opening region B2 such that titanium oxide or oxygen-introduced titanium is formed on the side thereof in contact with the reflection film 32-2. Also with this method, it is possible to suppress diffusion of titanium toward the reflection film 32-2 due to heat treatment performed in formation of the reflection film 32-2 or the first insulating film 33-1. That is to say, it is possible to achieve the same effects as those in the case where titanium nitride or nitrogen-introduced titanium is disposed on the side in contact with the reflection film 32-2, also by arranging titanium oxide or oxygen-introduced titanium on the side in contact with the reflection film 32-2.

The introducing oxygen to the first underlayer film 32-1*a* may be exposing the first underlayer film 32-1*a* to plasma of oxygen-containing gas. Moreover, the introducing oxygen to the first underlayer film 32-1*a* may be converting oxygen into ions and increasing the speed of the ions, thereby implanting the ions into the first underlayer film 32-1*a*. Moreover, the introducing oxygen to the first underlayer film 32-1*a* may be performing heat treatment in an oxygen atmosphere.

The entire disclosure of Japanese Patent Application No. 2014-023080, filed Feb. 10, 2014 is expressly incorporated by reference herein.

What is claimed is:

1. An electro-optical device, comprising:
   a reflection layer having a high reflectance portion and a low reflectance portion whose reflectance is lower than that of the high reflectance portion, the reflection layer having an underlayer film and a reflection film that are sequentially layered in a first direction; and
   a plurality of pixels, each having sequentially layered in the first direction:
      a part of the reflection layer;
      an optical distance adjusting layer;
      a pixel electrode;
      an insulating film having an opening that overlaps a part of the pixel electrode;
      a light-emitting functional layer; and
      an opposing electrode,
   wherein the reflection film is disposed across the plurality of pixels, the high reflectance portion is disposed so as to overlap at least part of the opening when viewed from above, the underlayer film in the high reflectance portion is made of titanium, the underlayer film in the low reflectance portion is made of titanium nitride or titanium oxide, and the reflection film is made of aluminum or alloy containing aluminum as a main component.

2. The electro-optical device according to claim 1,
   wherein the underlayer film is made of titanium, and
   a face, on a reflection film side, of the underlayer film in the low reflectance portion is covered by titanium nitride or titanium oxide.

3. An electronic device, comprising the electro-optical device according to claim 2.

4. The electro-optical device according to claim 1,
   wherein the underlayer film is made of titanium, and
   nitrogen or oxygen is introduced to a face, on a reflection film side, of the underlayer film in the low reflectance portion.

5. An electronic device, comprising the electro-optical device according to claim 4.

6. An electronic device, comprising the electro-optical device according to claim 1.

* * * * *